US007663854B1

(12) United States Patent  
Chiu (10) Patent No.: US 7,663,854 B1  
(45) Date of Patent: Feb. 16, 2010

(54) CIRCUIT LIMITING CASCADE FAILURE OF A SERIES OF LASER DIODES

(75) Inventor: Jim Tark Chiu, Los Altos, CA (US)

(73) Assignee: Vuemetrix, Inc., Sunnyvale, CA (US)

( * ) Notice: Subject to any disclaimer, the term of this patent is extended or adjusted under 35 U.S.C. 154(b) by 86 days.

(21) Appl. No.: 12/009,266

(22) Filed: Jan. 16, 2008

Related U.S. Application Data

(60) Provisional application No. 60/933,286, filed on Jun. 4, 2007.

(51) Int. Cl.  
*H02H 9/02* (2006.01)

(52) U.S. Cl. .................................... 361/93.9

(58) Field of Classification Search ............ 372/38.02, 372/33, 38.1, 38.07, 25, 38, 29.021; 361/56, 361/52, 18, 93.1, 93.9; 342/38.02  
See application file for complete search history.

(56) References Cited

U.S. PATENT DOCUMENTS

| | | | | |
|---|---|---|---|---|
| 4,484,331 A * | 11/1984 | Miller | ........................ | 372/34 |
| 5,498,973 A | 3/1996 | Cavaliere et al. | ............ | 324/765 |
| 6,580,735 B1 * | 6/2003 | Theodoras, II | ........... | 372/38.02 |
| 6,797,936 B1 | 9/2004 | Kessler et al. | | |
| 2005/0041707 A1 * | 2/2005 | Mangano et al. | ......... | 372/38.02 |

OTHER PUBLICATIONS

Horowitz &Hill, The Art of Electronics, Second Edition, pp. 229-230.*

"High-Density Laser Diode Controller," Photonics, Model 8016, URL: www.newport.com/file.store/PDFs/tempPDFs/Model_80lb_HighDensity2827.pdf, pp. 9-13.

"Laser Diode Burn-In and Life Test Systems- Butterfly Devices," Photonics, URL: www.newport.com/file_store/PDFs/tempPDFs/Laser_Diode_BurnIn4004.pdf, pp. 2-3.

"Multiple Channel Laser Diode Characterization Systems," Photonics, URL: www.newport.com/files_store/PDF's/tempPDFs/Multiple_Channel2848.pdf, pp. 66-67.

"Integrating Sphere Optical Power Measurement Systems," URL:www.newport.com, p. 3-30.

"Laser Diode Autobar Test & Characterization System," Newport, pp. 8-3-8-4.

* cited by examiner

*Primary Examiner*—Stephen W Jackson  
*Assistant Examiner*—Angela Brooks  
(74) *Attorney, Agent, or Firm*—Haverstock & Owens LLP (57) ABSTRACT

A laser diode control system is configured to limit cascade failure of a series of laser diodes. The laser diode series is coupled to an output filter of a power supply. The power supply is a switch-mode power supply and the output filter includes an LC circuit. The laser diode control system includes a protection circuit coupled to the laser diode series. The protection circuit includes a post regulator circuit and an inductor coupled in series to the laser diode series. The post regulator includes a transistor and two amplifiers configured to regulate a voltage across the transistor. In the event of a failure within the laser diode series, a current spike across the laser diode series is prevented by regulating the voltage across resistor.

25 Claims, 10 Drawing Sheets

CIRCUIT LIMITING CASCADE FAILURE OF A SERIES OF LASER DIODES

RELATED APPLICATION(S)

This Patent Application claims priority under 35 U.S.C. §119(e) of the co-pending, co-owned U.S. Provisional Patent Application No. 60/933,286, filed Jun. 4, 2007, and entitled "CIRCUIT LIMITING CASCADE FAILURE OF A SERIES OF LASER DIODES" which is also hereby incorporated by reference in its entirety.

FIELD OF THE INVENTION

The present invention relates to the field of laser diodes. More particularly, the present invention relates to a circuit configured to limit cascade failure of a series of laser diodes.

BACKGROUND OF THE INVENTION

For conventional laser diode based systems, it is desirable to power laser diodes with an electrically efficient and mechanically compact power supply. For this purpose, a switch-mode power supply is often used. A switch-mode power supply is an electronic power supply unit including a switching regulator. The switch-mode power supply actively switches a transistor between full saturation and full cutoff at a high rate. A resulting rectangular waveform is then passed through a low-pass output filter, typically an inductor and capacitor, to achieve an approximated output voltage.

Figure 1:
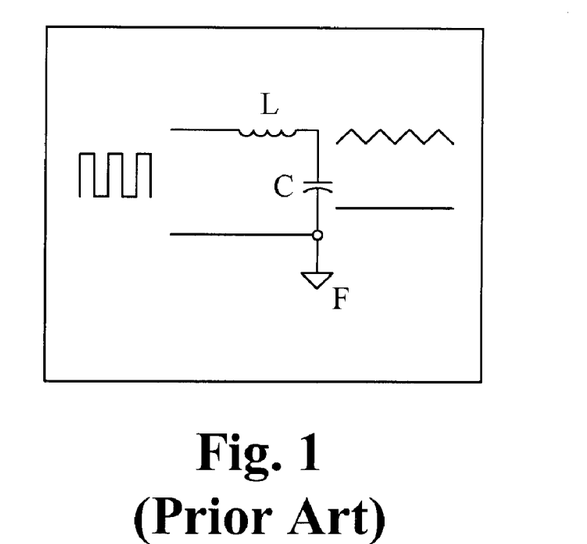
FIG. 1 illustrates the output filter stage of a conventional switch-mode power supply.

FIG. 1 illustrates the output filter stage of a conventional switch-mode power supply. The output filter includes an LC circuit, including an inductor L and a capacitor C. The output filter smooths the inherently pulsed output of the power supply. A rectangular waveform is passed through the output filter to effectively generate an output voltage across the capacitor C. The switch-mode power supply is configured to behave as a low bandwidth current source, which is required for the proper operation of a series of coupled laser diodes, but becomes a high frequency voltage source due to the presence of the output filter.

Figure 2:
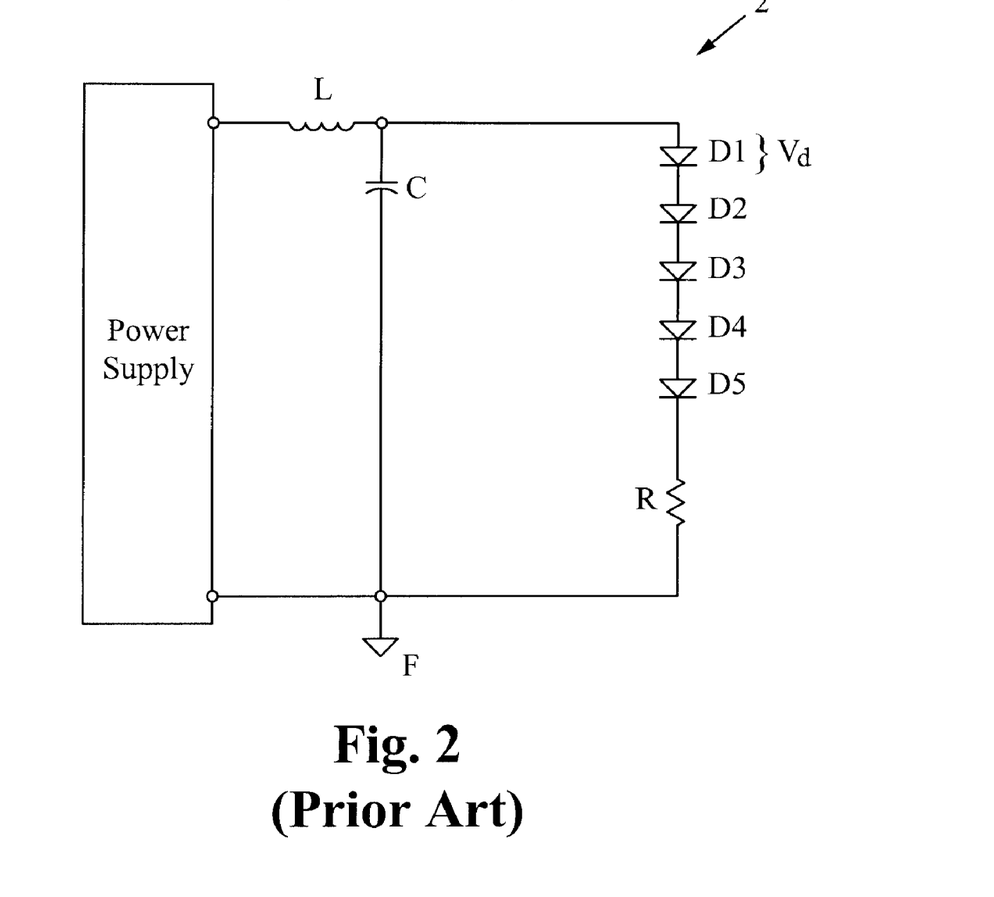
FIG. 2 illustrates a conventional circuit including a series of laser diodes coupled to the switch-mode power supply including the output filter of FIG. 1.

FIG. 2 illustrates a circuit 2 including a series of laser diodes coupled to the switch-mode power supply including the output filter of FIG. 1. The laser diodes D1, D2, D3, D4, D5 and the resistor R are coupled in series. The series of laser diodes and the resistor R are coupled across the capacitor C of the output filter. Although the series of laser diodes is shown in FIG. 2 as including five laser diodes, the series of laser diodes can include more or less than five laser diodes.

When such a switch-mode power supply is used to provide power to a set of laser diodes connected in series, problems arise when one of the laser diodes fails, effectively becoming electrically shorted. In such a situation, the forward bias voltage of the series of laser diodes instantaneously decreases. Within the switch-mode power supply, the instantaneous current of the capacitor C is proportional to the product of time rate voltage change and the capacitance of the capacitor C. When a laser diode fails, effectively electrically shorting, the result is a large surge of current from the capacitor C through the series of laser diodes. The size of the current, given by Ohm's Law I=V/R, can be catastrophic owing to the small size of the equivalent series resistance R and the extreme sensitivity of the laser diodes to damage by momentarily excessive current.

Another problem resulting from electrically connecting a number of laser diodes is intermittent connection. Intermittent connection occurs when a contact within the laser diode series is momentarily open, at which point the power supply drives up the voltage across the capacitor in the output filter in an attempt to compensate for the current short fall. When the intermittent contact is reestablished, the extra voltage across the capacitor can cause a damaging current spike across the series of laser diodes. Since laser diodes are expensive and fragile devices, their protection is a critical consideration in any system design.

Conventional current limiting circuits cannot be used to solve this problem due to their finite bandwidth. The finite bandwidth precludes the current limiting circuits from protecting the laser diodes against rapidly changing current.

SUMMARY OF THE INVENTION

A laser diode control system is configured to limit cascade failure of a series of laser diodes. The laser diode series is coupled to an output filter of a power supply. In some embodiments, the power supply is a switch-mode power supply and the output filter includes an LC circuit. The laser diode control system includes a protection circuit coupled to the laser diode series. The protection circuit includes a post regulator circuit and an inductor coupled in series to the laser diode series. In some embodiments, the post regulator circuit includes a transistor and two amplifiers. One amplifier is configured to regulate a voltage across the transistor. The other amplifier and the transistor form a secondary current source configured to track the current generated by the power supply. In the event of a failure within the laser diode series, a current spike across the laser diode series is prevented by regulating the voltage across the resistor.

In one aspect, a protection circuit includes a power source including an output filter, a plurality of diodes coupled in series, thereby forming a diode series, wherein the diode series is coupled to the output filter of the power supply, a post regulator circuit including a transistor coupled to the diode series and a first amplifier coupled to the transistor, a second amplifier, wherein an input of the second amplifier is coupled to the diode series and to the transistor, and an output of the second amplifier is coupled to an input of the first amplifier, and a first inductor coupled in series with the post regulator circuit. The output filter can include an output capacitor and a second inductor. In this case, the first inductor and the output capacitor can be configured to form a series resonance circuit. In some embodiments, an output of the diode series can be coupled to a first terminal of the transistor, a second terminal of the transistor can be coupled to the output of the first amplifier, and a third terminal of the transistor can be coupled to the input of the first amplifier. Further, the third terminal of the transistor and the input of the first amplifier can be coupled to a first terminal of the first inductor. The input of the second amplifier can be coupled to the output of the diode series and to the first terminal of the transistor. Where the output filter comprises an output capacitor, a first terminal of the output capacitor can be coupled to an input of the diode series and a second terminal of the output capacitor can be coupled to a second terminal of the first inductor. In some embodiments, the transistor is a metal-oxide-semiconductor field-effect transistor. In some embodiments, the second amplifier is configured to maintain the transistor in an active state. In some embodiments, the second amplifier is configured to maintain a constant voltage across the transistor. The transistor and the first amplifier can be configured to operate as a high frequency current source that tracks a current generated by the power supply. In some embodiments, the power supply is a switch-mode power supply.

In another aspect, the protection circuit described above is included within a control system. The control system includes a power source including an output filter, a plurality of diodes coupled in series, thereby forming a diode series, wherein the diode series is coupled to the output filter of the power supply, the protection circuit, and a control module coupled to the power source and to the protection circuit.

BRIEF DESCRIPTION OF THE DRAWINGS

Embodiments of the protection circuit are described relative to the several views of the drawings. Where appropriate and only where identical elements are disclosed and shown in more than one drawing, the same reference numeral will be used to represent such identical elements.

DETAILED DESCRIPTION OF THE EMBODIMENTS

Embodiments of the present invention are directed to an improved protection circuit configured within a laser diode control system. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the protection circuit are directed to limiting cascade failure of a series of laser diodes. The protection circuit provides constant current control by responding to sudden current changes.

Figure 3:
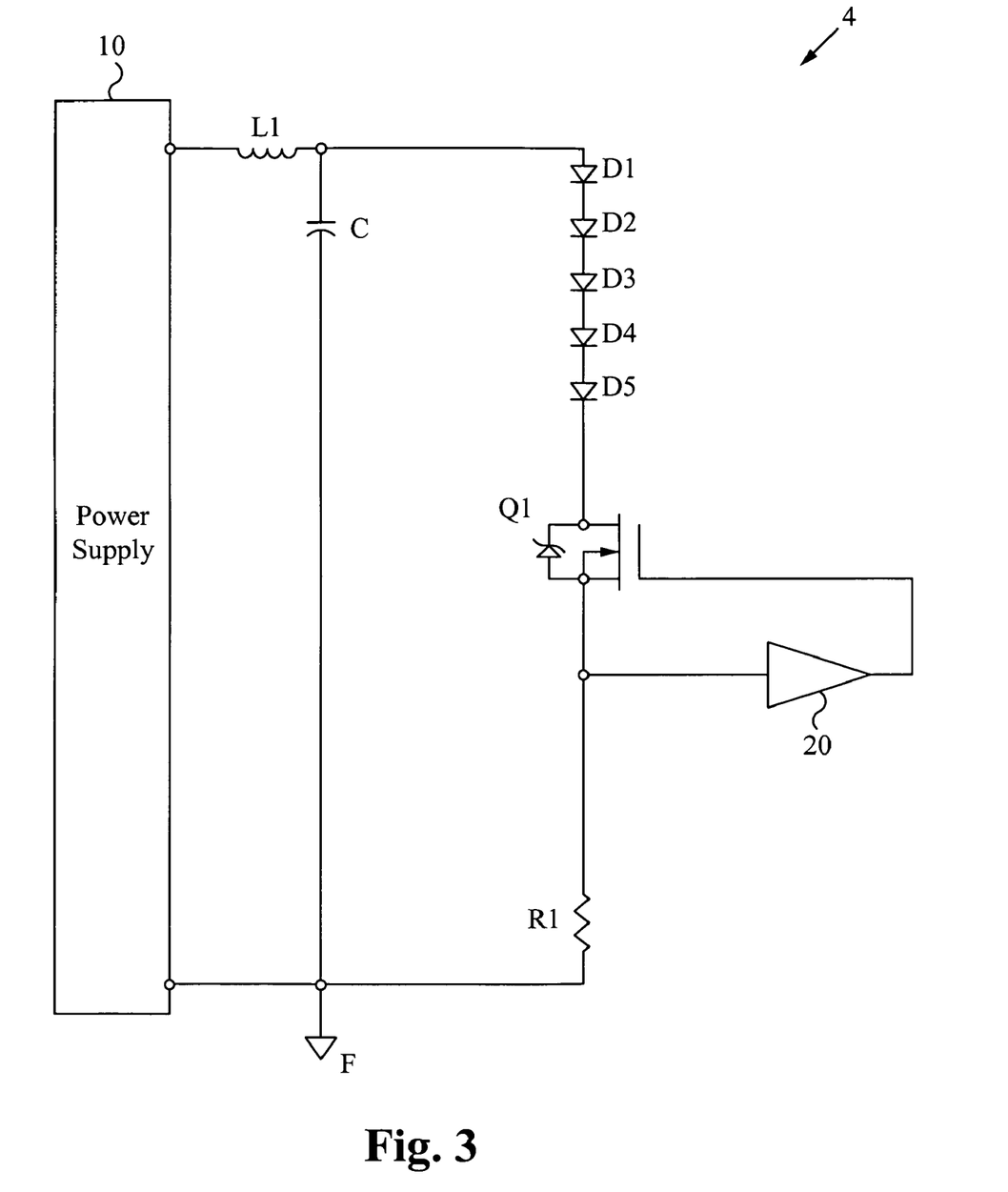
FIG. 3 illustrates a schematic circuit diagram of a first circuit including a series of laser diodes coupled to a switch-mode power supply.

FIG. 3 illustrates a schematic circuit diagram of a circuit 4 including a series of laser diodes coupled to a switch-mode power supply 10. The power supply 10 is coupled to a LC circuit configured to function as an output filter. The output filter is coupled to a series of laser diodes D1, D2, D3, D4, D5, a post regulator circuit, and a resistor R1. Although the series of laser diodes is shown in FIG. 3 as including five laser diodes, the series of laser diodes can include more or less than five laser diodes. The post regulator circuit includes a transistor Q1 and a comparator amplifier 20. The transistor Q1 is coupled to the cathode of the last laser diode in the series, which in this case is laser diode D5. In some embodiments, the transistor Q1 is a metal-oxide-semiconductor field-effect transistor (MOSFET). Alternatively, any type of transistor is able to be used. A first terminal of the transistor Q1 is coupled to the cathode of the laser diode D5, a second terminal of the transistor Q1 is coupled to the output of the comparator amplifier 20, and a third terminal of the transistor Q1 is coupled to the input of the comparator amplifier 20. The third terminal of the transistor Q1 and the input of the comparator amplifier 20 are also coupled to a first terminal of the resistor R1. The post regulator circuit including the comparator amplifier 20 is used to guard against excessive current passing through the series of laser diodes D1, D2, D3, D4, D5. In the event of excessive current, such as a current spike, the comparator amplifier 20 is configured to turn off the transistor Q1. However, since the comparator amplifier 20 does not have an infinitely fast slew rate, the comparator amplifier 20 causes an undesirable delay before turning off the transistor Q1.

The transistor Q1 and the comparator amplifier 20 function as a secondary current source. The primary current source is the power supply 10. As the primary current source and the secondary current source are coupled in series, when the primary current source is on, the secondary current source is in a saturated state. In the saturated state, the amplifier 20 is in a high state and drives the transistor Q1 to turn on hard. A finite delay is required for the amplifier 20 to change to a low state, which drives the secondary current source to the active state.

Figure 4:
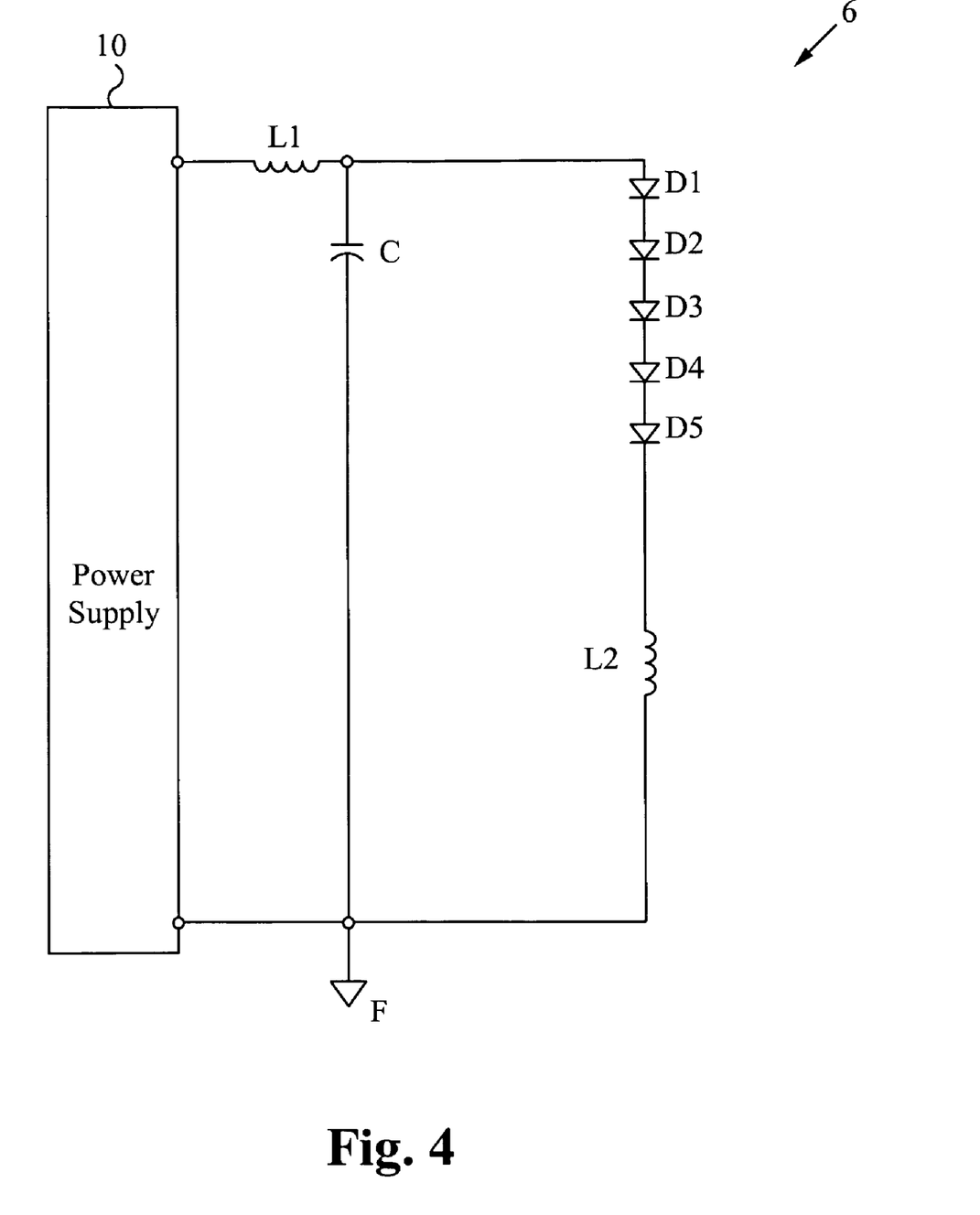
FIG. 4 illustrates a schematic circuit diagram of a second circuit that includes a series inductor added in the power path.

In view of the limitations of the circuit in FIG. 3, it is desired that a current limiting circuit is configured to transform a current transient pulse, or spike, into a rate limited waveform. Such a result can be achieved by adding a series inductor in the power path. FIG. 4 illustrates a schematic circuit diagram of a circuit 6 that includes a series inductor added in the power path. The circuit 6 in FIG. 4 is the same as the circuit 4 in FIG. 3 except that the post regulator circuit in FIG. 3 is replaced by an inductor L2. As shown in FIG. 4, the capacitor C and the inductor L2 form a series resonance circuit. In this configuration, the rate of current rise across the series of laser diodes is limited to $1/(\sqrt{L2*C})$, and the current peak is $I_{peak}=Vd/(\sqrt{L2/C})$. L2 is the inductance of the inductor L2, C is the capacitance of the capacitor C, and the voltage Vd is the voltage across the laser diode series. To achieve a small current peak Ipeak, the inductance L2 would have to be relatively large. Further, since the inductor L2 and the capacitor C form a resonance circuit, the voltage across the series of laser diodes can become reversed when voltage occurs across the capacitor C, thereby inducing a reverse voltage break down across the series of laser diodes.

Figure 5:
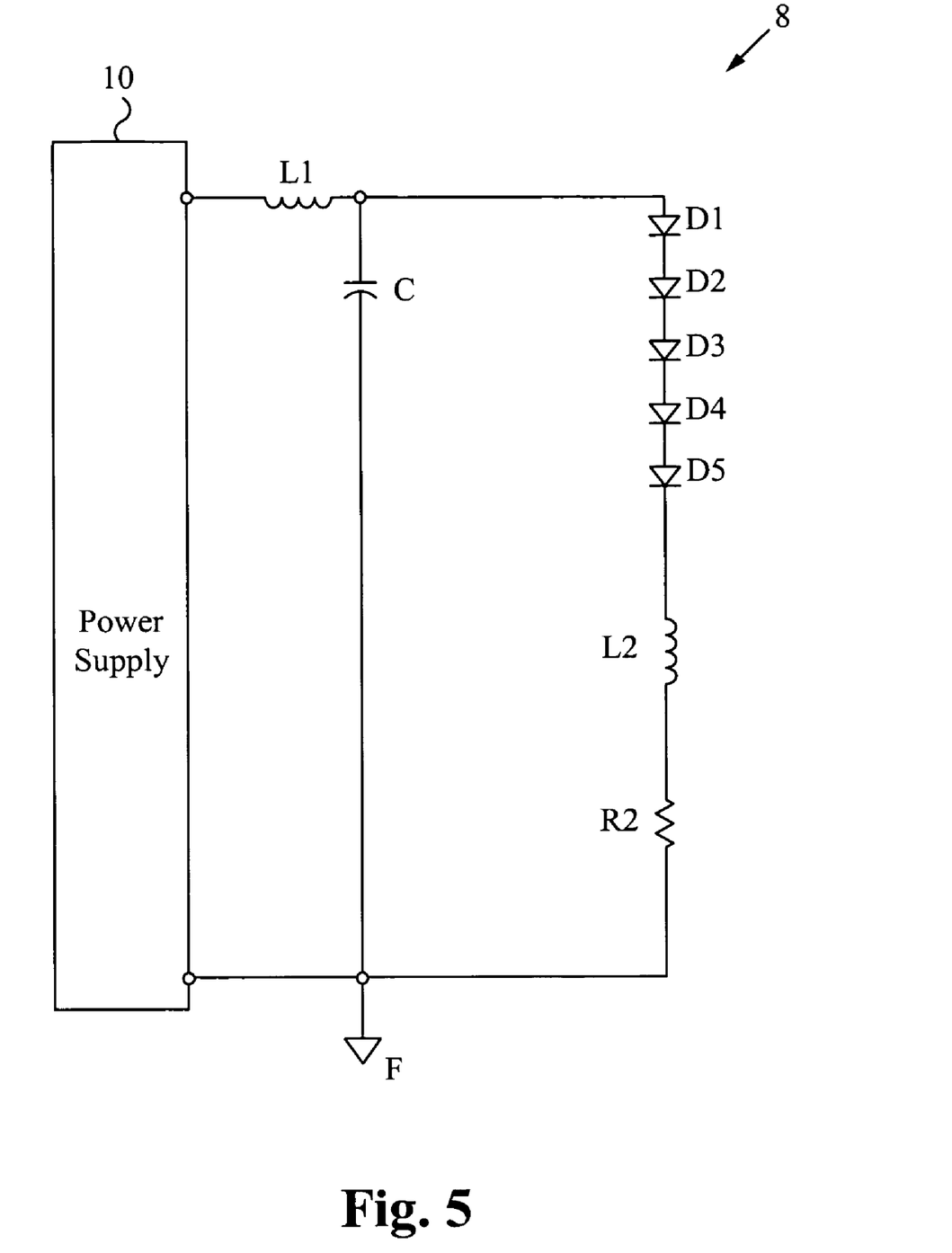
FIG. 5 illustrates a schematic circuit diagram of a third circuit that includes a series inductor and resistor added in the power path.

To prevent such a reverse voltage across the series laser diodes, a ballast resistor can be added so that the resonance of the L2C circuit becomes over damped. FIG. 5 illustrates a schematic circuit diagram of a circuit 8 that includes a series inductor and resistor added in the power path. The circuit 8 in FIG. 5 is the same as the circuit 6 in FIG. 4 with the addition of the resistor R2 added in series to the inductor L2 and the series of laser diodes D1, D2, D3, D4, D5. The addition of the resistor R2 causes a critical damping of the L2C resonance circuit, thereby resolving the reverse bias break down problem. Most applications require a relatively large inductance L2 and resistance R. A large value of inductance L2 requires an inductor with a large volume of space, and a large value of resistance R utilizes a large amount of power and generates a correspondingly large amount of heat which needs to be dissipated. Both short comings defeat the purpose of a system using a switch-mode power supply to minimize power loss, reduce size, and reduce weight.

Figure 6:
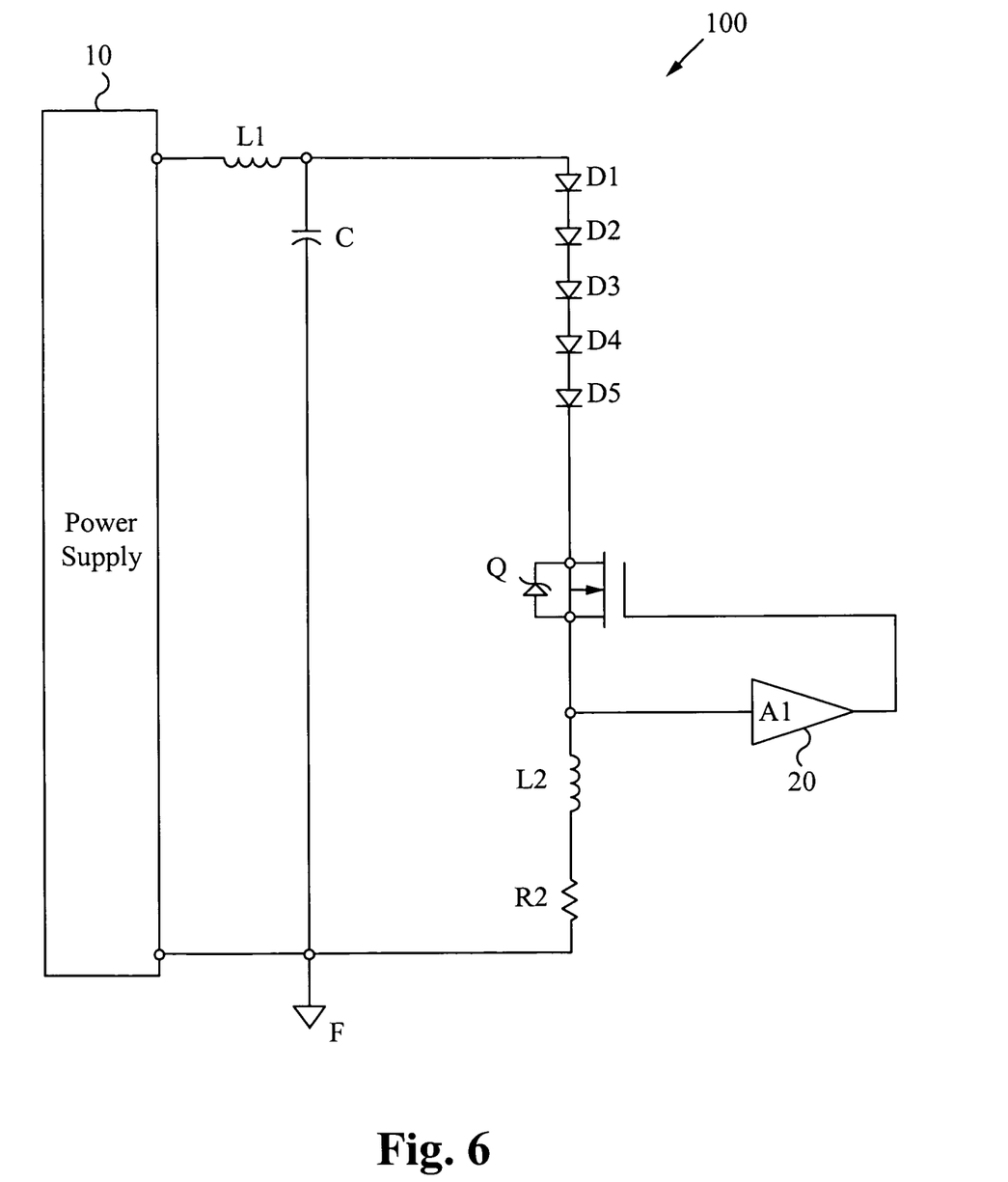
FIG. 6 illustrates a schematic circuit diagram of a fourth circuit that includes a series inductor added in the power path of the circuit in FIG. 3.

FIG. 6 illustrates a schematic circuit diagram of a circuit 100 that includes a series inductor added in the power path of the circuit 4 in FIG. 3. The circuit 100 in FIG. 6 is the same as the circuit 4 in FIG. 3 with the addition of the inductor L2 in series with the post regulator circuit and the series of laser diodes D1, D2, D3, D4, D5. In particular, the inductor L2 is coupled to the third terminal of the transistor Q and to the input of the amplifier 20. If the transistor Q is a MOSFET, then the inductor L2 is coupled to a source of the MOSFET Q. Such a configuration has the effect of converting a current surge into a controlled rate of rise rather than a sharp current spike, where the current surge can be the result of a short or intermittent connection of one of the laser diodes. In such an event, the inductor L2 absorbs a portion of any corresponding voltage rise across the capacitor C. The amplifier 20 senses the voltage rise across the inductor L2 and correspondingly controls the transistor Q such that a small voltage induced across the inductor L2 translates into a large change in the channel resistance of the transistor Q. The resulting current Id across the series of laser diodes is given by current Id=(Gmfet*(−A1)*L)dI/dt, where A1 is the gain of the amplifier 20 and Gmfet is the transconductance of the transistor Q. By absorbing a portion of the voltage rise, the inductor L2 provides a delay that enables the amplifier 20 to react in response to the current surge. To minimize power dissipation on the transistor Q, the voltage across the capacitor C must match the voltage across the load, represented by resistor R2, and across the transistor Q. However, the secondary current source, as provided by the transistor Q and the amplifier 20, suffers from a response delay when in the saturation state. Such a delay is sufficient to damage the laser diodes.

Figure 7:
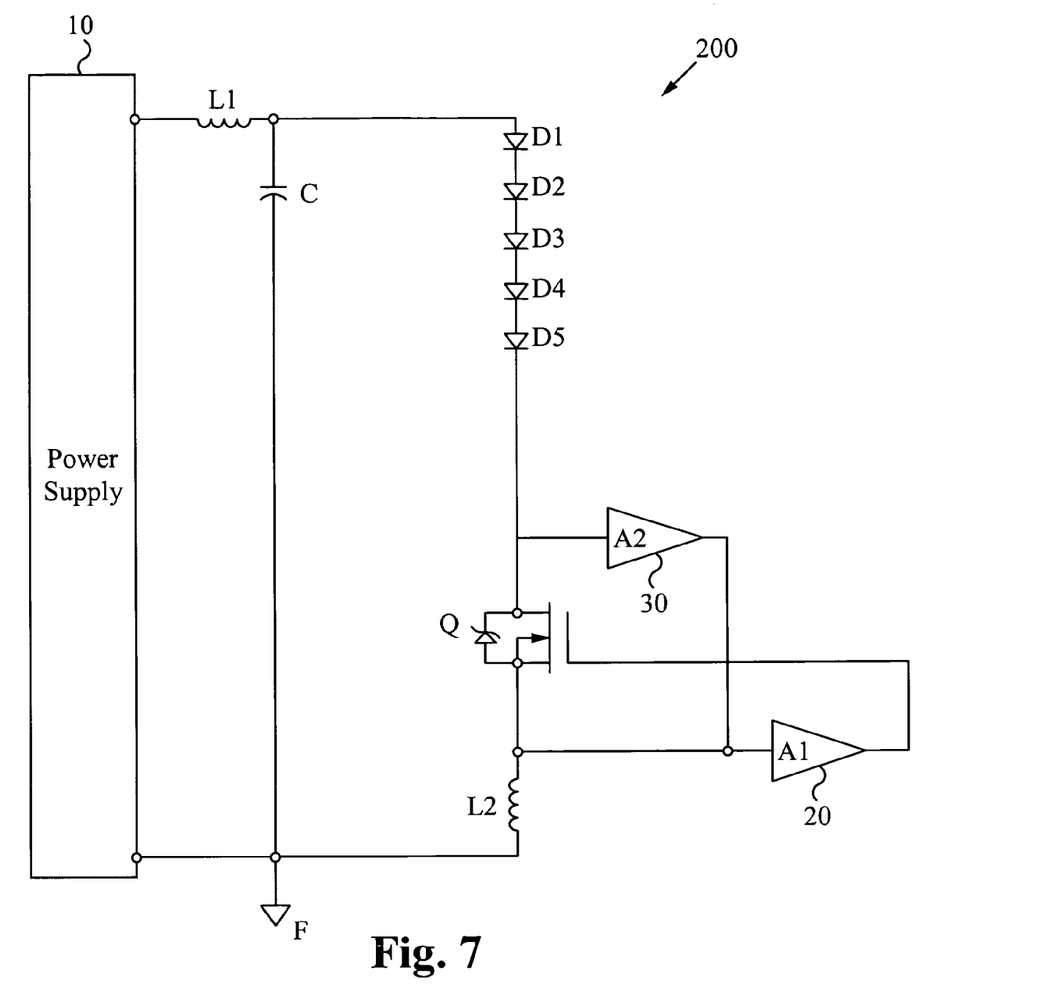
FIG. 7 illustrates a schematic circuit diagram of a fifth circuit that includes a second amplifier added to the circuit of FIG. 6.

FIG. 7 illustrates a schematic circuit diagram of a circuit 200 that includes a second amplifier added to the circuit 100 of FIG. 6. The circuit 200 in FIG. 7 is the same as the circuit 100 in FIG. 6 with the addition of the second amplifier 30 and the removal of the resistor R2. In particular, an input of the second amplifier 30 is coupled to the first terminal of the transistor Q and to the cathode of the last laser diode in the laser diode series, in this case the laser diode D5. The output of the amplifier 30 is coupled to the input of the amplifier 20. The second amplifier 30 is configured as a slow voltage control loop used to sense the voltage of the transistor Q and to feed a signal to the amplifier 20. In this manner, the voltage across the transistor Q is maintained substantially constant and the current provided by the transistor Q and the amplifier 20 (the secondary current source) tracks the current generated by the switch-mode power supply 10. Such a configuration maintains the circuit 200 in an active state rather than in a standby saturated state, as in the circuit 4 in FIG. 3. This means that both current sources, the primary current source and the secondary current source, are simultaneously maintained in the active state. Since the amplifier 30 regulates the voltage across the transistor Q, when the circuit 200 is in the active state, power loss can be minimized by setting the voltage across the transistor Q to a relatively small value.

The amplifier 20 takes time to change to an active state from a saturation state, so there is a response delay if the amplifier 20 is allowed to enter the saturation state. Such a delay is sufficient to allow damage to the laser diodes. The amplifier 30 is configured so as to maintain the amplifier 20 in the active state, thereby eliminating any response delay and enabling an instantaneous response from the inductor L2.

The amplifier 30 detects the voltage across the transistor Q to servo the amplifier 20. Where the transistor Q is a MOSFET, the amplifier 30 ensures that the voltage at the MOSFET drain is greater than zero, thereby ensuring that the transistor Q is active.

Within the secondary current source, the input of the amplifier 20 senses the inductor L2, and the input of the amplifier 20 is coupled to the voltage sensing amplifier 30. This configuration forces the secondary current source to track the current passing through the laser diode series.

The output of the amplifier 30 is not used to control the transistor Q. Instead, the output of the amplifier 30 is coupled to the input of the amplifier 20, thereby controlling the amount of current generated by the secondary current source. The amplifier 30, which senses the voltage across the transistor Q, modifies the amount of current in the current loop such that the transistor Q is in the active state, where the current loop is the loop formed by the transistor Q and the amplifier 20.

The amplifier 30 modulates the amplifier 20 to function as a tracking high frequency current source, and the switch-mode power supply 20 functions as a low frequency voltage source. In this sense, the circuit 200 includes a relatively wide bandwidth current source, limited to a peak value by the self-resonance of the inductor L2. Due to the wide bandwidth of the circuit 200, most of the switch-mode power supply noise is eliminated, as long as the dynamic range of the transistor Q is not exceeded.

In an exemplary application, the transistor Q, the amplifier 20, the amplifier 30, and the inductor L2 are collectively configured as part of a laser diode control system. As part of the laser diode control system, the transistor Q, the amplifier 20, the amplifier 30, and the inductor L2 are coupled to the series of laser diodes and the output filter of the power supply in the manner described above in relation to the circuit 200. The laser diode control system also includes a controller configured to monitor the functional parameters of the circuit 200. In some embodiments, the laser diode control system is configured as an integrated module including the controller, the transistor Q, the amplifier 20, the amplifier 30, and the inductor L2. In other embodiments, the transistor Q, the amplifier 20, the amplifier 30, and the inductor L2 are configured as a first sub-module, and the controller is configured as a separate second sub-module, such as a host computer, within the laser diode control system. Collectively, the transistor Q, the amplifier 20, the amplifier 30, the inductor L2, and the controller are referred to as a protection circuit.

Figure 8:
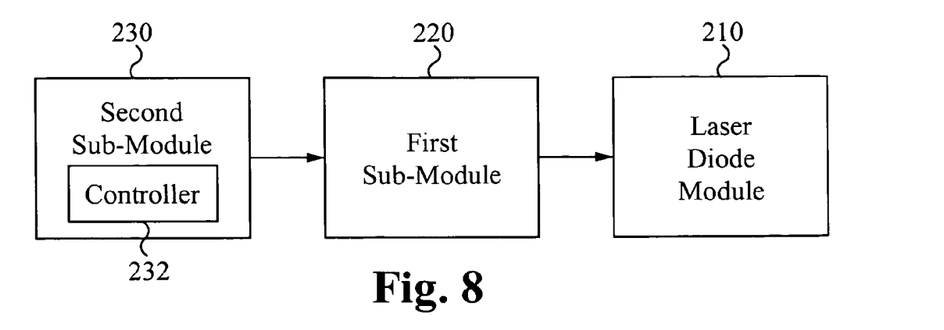
FIG. 8 illustrates a block diagram of an exemplary laser diode control system.

FIG. 8 illustrates a block diagram of an exemplary laser diode control system. A laser diode module 210 includes the series of coupled laser diodes D1, D2, D3, D4, D5, the power supply 10, and the output filter including the inductor L1 and the capacitor C. The first sub-module 220 includes transistor Q, the amplifier 20, the amplifier 30, and the inductor L2. The first sub-module 220 is coupled to the laser diode module 210 in a manner similar to that of circuit 200 in FIG. 7. The second sub-module 230 includes a controller 232 configured to monitor the functional parameters of the first sub-module 220 and the laser diode module 210, and to control the operation of the power supply 10. The first sub-module 220 and the second sub-module 230 are collectively referred to as the protection circuit. The controller 232 is configured to monitor the series of laser diodes D1, D2, D3, D4, D5 to detect when one or more laser diodes fail or when an electrical connection becomes intermittent, collectively referred to as a fault. If a fault is detected, the switch-mode power supply 10 is turned off by the controller 232.

In an alternative configuration, the first sub-module 220 and the second sub-module 230 are integrated as a single module. This integrated configuration operates in a similar manner as the separate modules described in FIG. 8.

In some embodiments, the laser diode control system includes a graphical user interface configured to enable a user to provide instructions to or receive signals from the controller.

In some embodiments, the controller 232 is also configured to gradually ramp up current across the series of laser diodes to an operating current so that the circuit 200 operates within it's active operating state. When enabled, the protection circuit opposes changes in output current. When the user increases the requested current, the protection circuit takes time to adjust to the new current. In some embodiments, this process is managed automatically by the controller so as to ramp the current slowly to the new setting, insuring that the protection circuit is maintained within its proper operating range. This configuration results in a response time to current increases. The response time depends on the load characteristics of the laser diode control system, and the ramp up rate is dictated by the requirements of the protection circuit. When the current is reduced, a corresponding slow ramp-down does not occur. The time constant of the controller response is determined by the load impedance of the protection circuit.

In some embodiments, the slow ramp up of current can be disabled. In this case, the controller automatically disengages the protection circuit when a current change is made, and re-enables after a predetermined time period.

Figure 9:
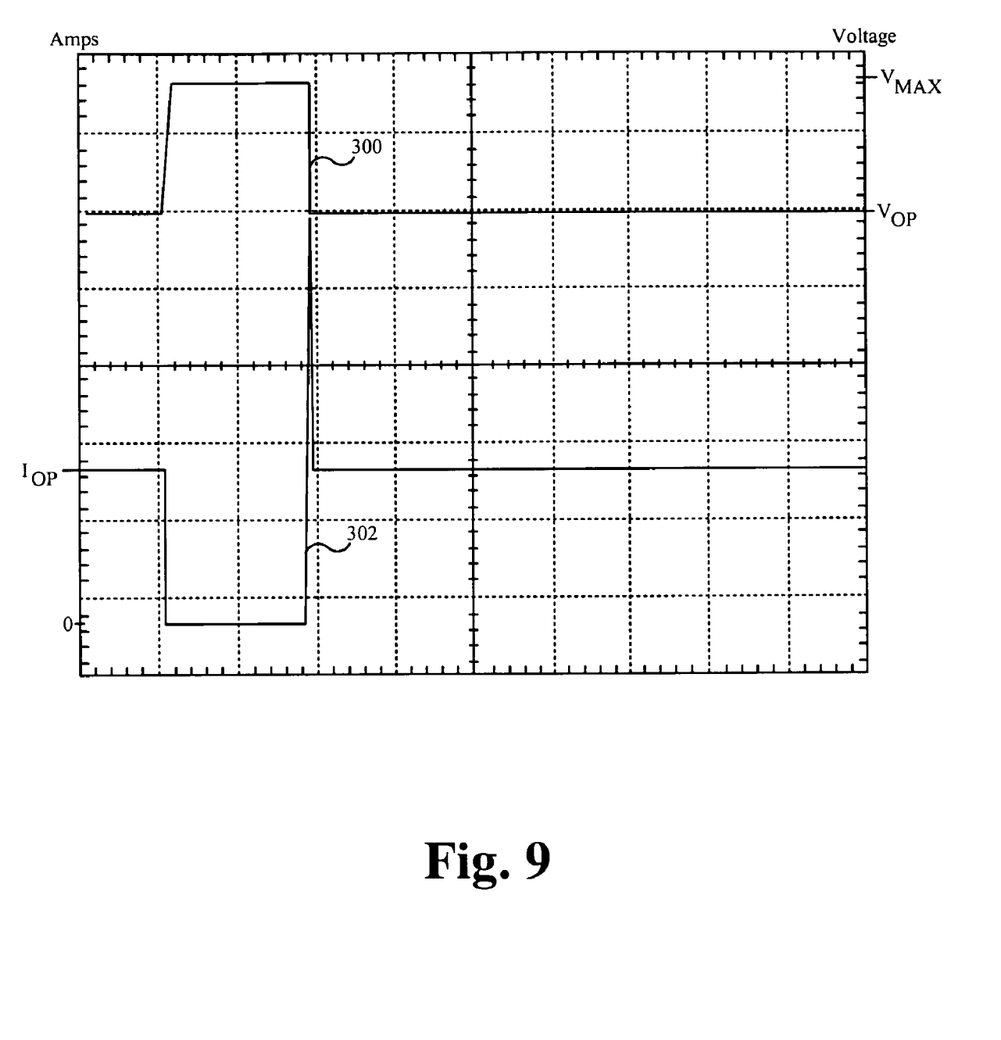
FIGS. 9-12 illustrate exemplary data graphs corresponding to various conditions of the series of laser diodes and the protection circuit.

FIGS. 9-12 illustrate exemplary data graphs corresponding to various conditions of the series of laser diodes and the protection circuit. Each of the graphs shown in FIGS. 9-12 include an x-axis measuring time, and a y-axis measuring the voltage across the output capacitor C and the current across the series of laser diodes. FIG. 9 illustrates exemplary test data corresponding to an intermittent electrical connection across the series of laser diodes when the protection circuit is turned off. A curve 300 measures the voltage across the capacitor C. A curve 302 measures the current across the series of laser diodes. At the left hand side of each curve, the current is at an operation current Iop and the corresponding voltage across the capacitor C is at an operating voltage Vop. To simulate an intermittent connection, the transistor Q is turned off. As a result, the current across the series of laser diodes drops to zero. The corresponding voltage across the capacitor C jumps to a maximum voltage Vmax. When the connection is re-established, simulated by turning on the transistor Q, a current spike is generated across the series of laser diodes due to the increased voltage Vmax across the capacitor C, possibly leading to laser diode failure.

Figure 10:
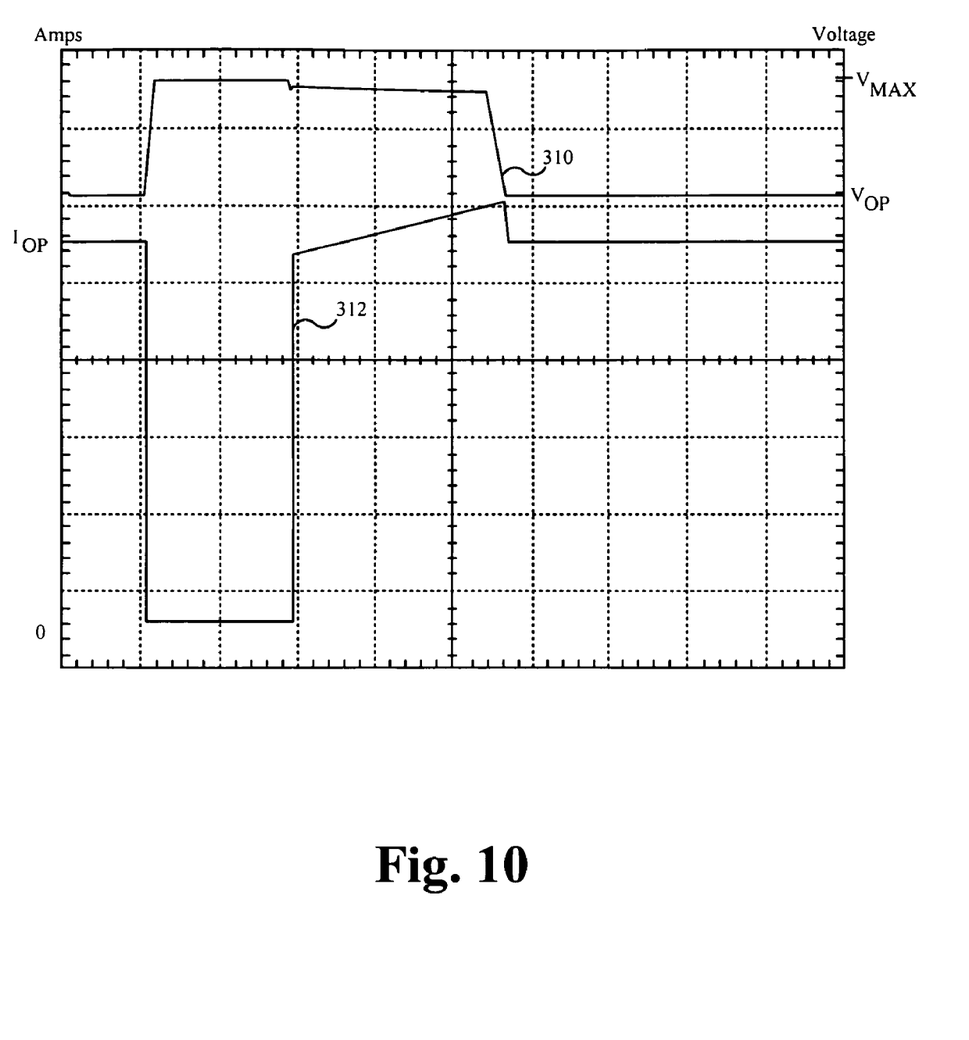

FIG. 10 illustrates exemplary test data corresponding to an intermittent electrical connection across the series of laser diodes when the protection circuit is turned on. A curve 310 measures the voltage across the capacitor C. A curve 312 measures the current across the series of laser diodes. At the left hand side of each curve, the current is at an operation current Iop and the corresponding voltage across the capacitor C is at an operating voltage Vop. To simulate an intermittent connection, the transistor Q is turned off. As a result, the current across the series of laser diodes drops to zero, and the corresponding voltage across the capacitor C jumps to a maximum voltage Vmax. When the connection is re-established, simulated by turning on the transistor Q, only a minimal current overshoot is generated across the series of laser diodes due to the increased voltage Vmax across the capacitor C.

Figure 11:
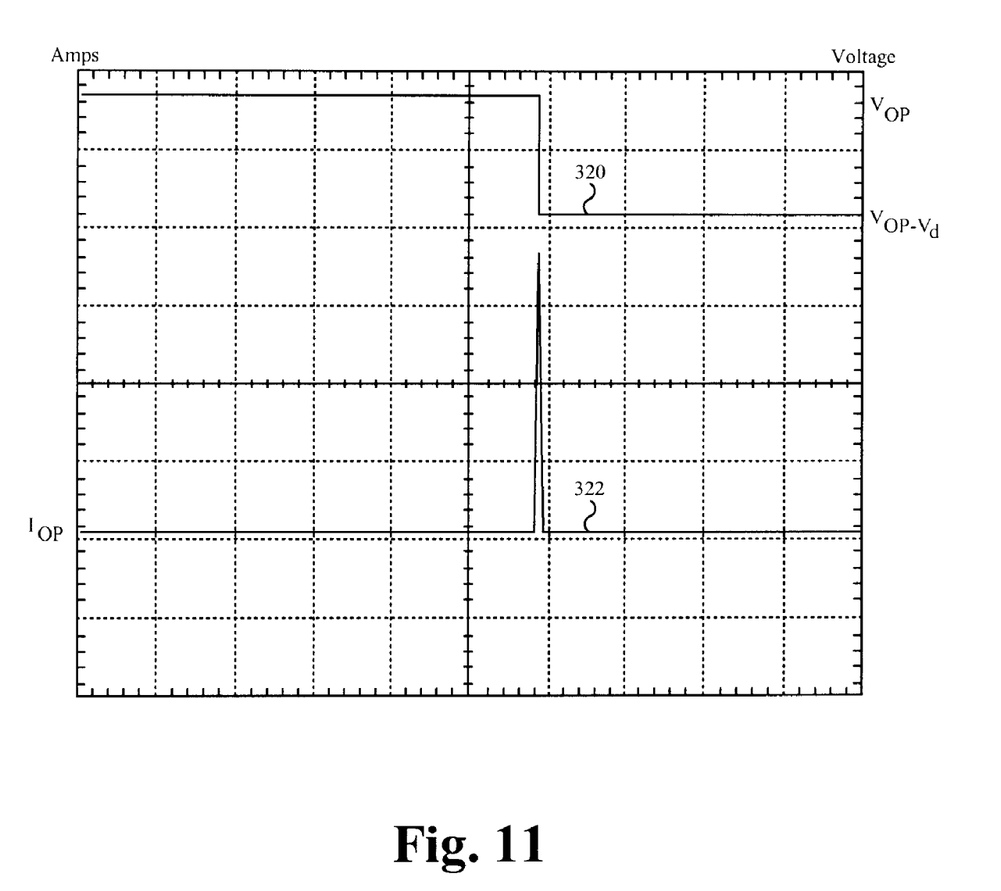

FIG. 11 illustrates exemplary test data corresponding to a short circuit across one of the laser diodes in the series of laser diodes when the protection circuit is turned off. A curve 320 measures the voltage across the capacitor C. A curve 322 measures the current across the series of laser diodes. At the left hand side of each curve, the current is at an operation current Iop and the corresponding voltage across the capacitor C is at an operating voltage Vop. To simulate a short circuit, a bypass path is applied to one of the laser diodes. When the short circuit is applied, simulated by applying the bypass path, a current spike is generated across the series of laser diodes and the voltage across the capacitor C drops to the voltage $V_{OP}-V_d$, possibly leading to laser diode failure.

Figure 12:
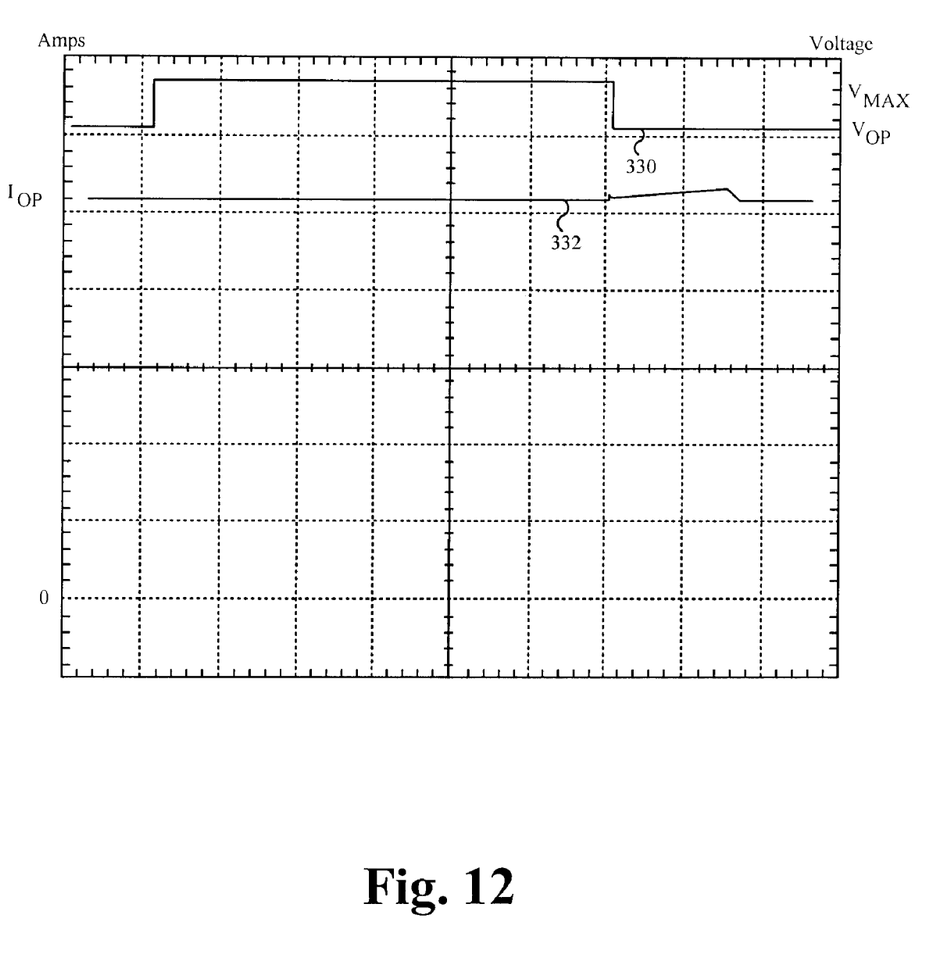

FIG. 12 illustrates exemplary test data corresponding to an intermittent electrical connection across the series of laser diodes when the protection circuit is turned on. A curve 330 measures the voltage across the capacitor C. A curve 332 measures the current across the series of laser diodes. At the left hand side of each curve, the current is at an operation current Iop and the corresponding voltage across the capacitor C is at an operating voltage Vop. To simulate the short circuit, a bypass path is applied to one of the laser diodes. As a result, the voltage across the capacitor C jumps to a maximum voltage Vmax. When the short circuit is removed, simulated by opening up the bypass path, only a minimal current overshoot is generated across the series of laser diodes due to the increased voltage Vmax across the capacitor C.

The protection circuit is described above as being applied to laser diodes and to a laser diode control system. In other embodiments, the protection circuit is applied to light emitting diodes. In general, the protection circuit can be applied to any type of diodes.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A protection circuit comprising:
   a. a power source including an output filter;
   b. a plurality of diodes coupled in series, thereby forming a diode series, wherein the diode series is coupled to the output filter of the power supply;
   c. a post regulator circuit including a transistor coupled to the diode series and a first amplifier coupled to the transistor;
   d. a second amplifier, wherein an input of the second amplifier is coupled to the diode series and to the transistor, and an output of the second amplifier is coupled to an input of the first amplifier; and
   e. a first inductor coupled in series with the post regulator circuit.

2. The protection circuit of claim 1 wherein the output filter includes an output capacitor and a second inductor.

3. The protection circuit of claim 2 wherein the first inductor and the output capacitor are configured to form a series resonance circuit.

4. The protection circuit of claim 1 wherein an output of the diode series is coupled to a first terminal of the transistor, a second terminal of the transistor is coupled to the output of the first amplifier, and a third terminal of the transistor is coupled to the input of the first amplifier.

5. The protection circuit of claim 4 wherein the third terminal of the transistor and the input of the first amplifier are coupled to a first terminal of the first inductor.

6. The protection circuit of claim 5 wherein the input of the second amplifier is coupled to the output of the diode series and to the first terminal of the transistor.

7. The protection circuit of claim 6 wherein the output filter comprises an output capacitor and a first terminal of the output capacitor is coupled to an input of the diode series and a second terminal of the output capacitor is coupled to a second terminal of the first inductor.

8. The protection circuit of claim 1 wherein the transistor comprises a metal-oxide-semiconductor field-effect transistor.

9. The protection circuit of claim 1 wherein the second amplifier is configured to maintain the transistor in an active state.

10. The protection circuit of claim 1 wherein the second amplifier is configured to maintain a constant voltage across the transistor.

11. The protection circuit of claim 1 wherein the transistor and the first amplifier are configured to operate as a high frequency current source that tracks a current generated by the power supply.

12. The protection circuit of claim 1 wherein the power supply comprises a switch-mode power supply.

13. A control system comprising:
   a. a power source including an output filter;
   b. a plurality of diodes coupled in series, thereby forming a diode series, wherein the diode series is coupled to the output filter of the power supply;
   c. a protection circuit comprising:
      i. a post regulator circuit including a transistor coupled to the diode series and a first amplifier coupled to the transistor;
      ii. a second amplifier, wherein an input of the second amplifier is coupled to the diode series and to the transistor, and an output of the second amplifier is coupled to an input of the first amplifier; and
      iii. a first inductor coupled in series with the post regulator circuit; and
   d. a control module coupled to the power source and to the protection circuit.

14. The system of claim 13 wherein the control module is configured to monitor functional parameters of the diode series and the protection circuit, and to control operation of the power source.

15. The system of claim 13 wherein the output filter includes an output capacitor and a second inductor.

16. The system of claim 15 wherein the first inductor and the output capacitor are configured to form a series resonance circuit.

17. The system of claim 13 wherein an output of the diode series is coupled to a first terminal of the transistor, a second terminal of the transistor is coupled to the output of the first amplifier, and a third terminal of the transistor is coupled to the input of the first amplifier.

18. The system of claim 17 wherein the third terminal of the transistor and the input of the first amplifier are coupled to a first terminal of the first inductor.

19. The system of claim 18 wherein the input of the second amplifier is coupled to the output of the diode series and to the first terminal of the transistor.

20. The system of claim 19 wherein the output filter comprises an output capacitor and a first terminal of the output capacitor is coupled to an input of the diode series and a second terminal of the output capacitor is coupled to a second terminal of the first inductor.

21. The system of claim 13 wherein the second amplifier is configured to maintain the transistor in an active state.

22. The system of claim 13 wherein the second amplifier is configured to maintain a constant voltage across the transistor.

23. The system of claim 13 wherein the transistor and the first amplifier are configured to operate as a high frequency current source that tracks a current generated by the power supply.

24. The system of claim 13 wherein the power supply comprises a switch-mode power supply.

25. A protection circuit comprising:
   a. a power source including an output filter, wherein the output filter includes an output capacitor;
   b. a plurality of diodes coupled in series, thereby forming a diode series, wherein a first terminal of the output capacitor is coupled to an input of the diode series;
   c. a post regulator circuit including a transistor and a first amplifier, wherein an output of the diode series is coupled to a first terminal of the transistor, a second terminal of the transistor is coupled to an output of the first amplifier, and a third terminal of the transistor is coupled to an input of the first amplifier;
   d. a second amplifier, wherein an input of the second amplifier is coupled to the output of the diode series and to the first terminal of the transistor, and an output of the second amplifier is coupled to an input of the first amplifier and to the third terminal of the transistor; and
   e. an inductor coupled in series with the post regulator circuit, wherein the third terminal of the transistor, the input of the first amplifier, and the output of the second amplifier are coupled to a first terminal of the inductor, and a second terminal of the output capacitor is coupled to a second terminal of the inductor.

* * * * *